(12) United States Patent
Juestel et al.

(10) Patent No.: US 7,573,189 B2
(45) Date of Patent: *Aug. 11, 2009

(54) ILLUMINATION SYSTEM COMPRISING A RADIATION SOURCE AND A FLUORESCENT MATERIAL

(75) Inventors: Thomas Juestel, Witten (DE); Wolfgang Busselt, Roetgen (DE); Peter Schmidt, Aachen (DE); Walter Mayr, Alsdorf (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 167 days.

This patent is subject to a terminal disclaimer.

(21) Appl. No.: 10/549,231

(22) PCT Filed: Mar. 5, 2004

(86) PCT No.: PCT/IB2004/000733

§ 371 (c)(1),
(2), (4) Date: Sep. 12, 2005

(87) PCT Pub. No.: WO2004/084261

PCT Pub. Date: Sep. 30, 2004

(65) Prior Publication Data

US 2006/0158097 A1 Jul. 20, 2006

(30) Foreign Application Priority Data

Mar. 17, 2003 (EP) .................................. 03100668

(51) Int. Cl.
*H04N 9/31* (2006.01)
*H01J 1/62* (2006.01)
*H05B 33/00* (2006.01)
*H01J 31/04* (2006.01)

(52) U.S. Cl. ................ 313/503; 313/502; 313/504; 313/506; 362/293; 257/81; 257/94

(58) Field of Classification Search .................. None
See application file for complete search history.

(56) References Cited

U.S. PATENT DOCUMENTS

| | | | |
|---|---|---|---|
| 5,998,925 A | 12/1999 | Shimizu et al. | |
| 6,466,135 B1* | 10/2002 | Srivastava et al. | 340/815.4 |
| 2002/0113244 A1* | 8/2002 | Barnett et al. | 257/98 |
| 2002/0145384 A1* | 10/2002 | Jeganathan et al. | 313/512 |
| 2002/0158565 A1* | 10/2002 | Setlur et al. | 313/486 |
| 2002/0180345 A1* | 12/2002 | Hen | 313/499 |
| 2002/0185965 A1* | 12/2002 | Collins et al. | 313/501 |
| 2002/0195587 A1* | 12/2002 | Srivastava et al. | 252/301.4 R |

* cited by examiner

*Primary Examiner*—Sikha Roy
*Assistant Examiner*—Tracie Green

(57) ABSTRACT

The invention relates to an illumination system comprising a radiation source and a fluorescent material comprising at least one phosphor capable of absorbing a portion of the light emitted by the radiation source and emitting light of a wavelength different from that of the absorbed light; wherein said at least one phosphor is a green-emitting cerium-activated lutetium-aluminum-garnet of general formula $(Lu_{1-x-y-a-b}Y_xGd_y)_3(Al_{1-z}Ga_z)_5O_{12}:Ce_aPr_b$ wherein $0<x<1$, $0<y<1$, $0<z£0.1$, $0<a£0.2$ and $0<b£0.1$. The invention also relates to with a green-emitting cerium-activated lutetium-aluminum-garnet of general formula $(Lu_{1-x-y-a-b}Y_xGd_y)_3(Al_{1-z}Ga_z)_5O_{12}:Ce_aPr_b$ wherein $0<x<1$, $0<y<1$, $0<z£0.1$, $0<a£0.2$ and $0<b£0.1$.

11 Claims, 4 Drawing Sheets

ILLUMINATION SYSTEM COMPRISING A RADIATION SOURCE AND A FLUORESCENT MATERIAL

The present invention generally relates to an illumination system comprising a radiation source and a fluorescent material comprising a phosphor. The invention also relates to a phosphor for use in such an illumination system.

More particularly, the invention relates to an illumination system and fluorescent material comprising a phosphor for the generation of specific, colored light, including white light, by luminescent down conversion and additive color mixing based on a ultraviolet or blue radiation emitting radiation source. A light-emitting diode as a radiation source is especially contemplated.

Recently, various attempts have been made to male white light-emitting illumination systems by using light-emitting diodes as radiation sources. When generating white light with an arrangement of red, green and blue light-emitting diodes, there has been such a problem that white light of the desired tone cannot be generated due to variations in the tone, luminance and other factors of the light-emitting diodes.

In order to solve these problems, there have been previously developed various illumination systems, which convert the color of light, which is emitted by light-emitting diodes, by means of a fluorescent material comprising a phosphor to provide a visible white light illumination.

Previous illumination systems have been based in particular either on the trichromatic (RGB) approach, i.e. on the mixing of three colors, namely red, green and blue, in which case the latter component may be provided by a phosphor or by the primary emission of the LED or in a second, simplified solution, on the dichromatic (BY) approach, mixing yellow and blue colors, in which case the yellow component may be provided by a yellow phosphor and the blue component may be provided by the primary emission of a blue LED.

In particular, the dichromatic approach, as disclosed in e.g. U.S. Pat. No. 5,998,925, uses a blue light-emitting diode of InGaN semiconductor combined with an $Y_3Al_5O_{12}$:Ce (YAG-$Ce^{3+}$) phosphor. The YAG-$Ce^{3+}$ phosphor is coated on the InGaN LED, and a portion of the blue light emitted from the LED is converted into yellow light by the phosphor. Another portion of the blue light from the LED is transmitted through the phosphor. Thus, this system emits both blue light-emitted from the LED, and yellow light emitted from the phosphor. The mixture of blue and yellow emission bands is perceived as white light by an observer with a CRI in the middle 80s and a color temperature, Tc, that ranges from about 6000 K to about 8000 K.

However, white light LEDs based on the dichromatic approach can only be used to a limited extent for general-purpose illumination, on account of their poor color rendering caused by the absence of red color components.

Desirable white light lamp characteristics for general purposes are high brightness and high color rendering at economical cost. Improved efficiency and much improved color rendering ability is possible with the trichromatic lamp spectrum according to the RGB-approach having three emission bands: red at 590 to 630, green at 520 to 560 and blue at 450 nm. These wavelengths are near peaks in the CIE tristimulus functions, which are used to define colors.

Unfortunately, until today no green emitter with sufficient efficiency and stability is known.

Therefore, there is a need to provide new phosphors that are excitable in the near UV-to-blue range and emit in the visible green range. It is also desirable to provide novel phosphor blends that emit light in a broad wavelength range from green to red so that they may be combined with UV/blue LEDs to produce white light of high efficiency and/or high color rendering index ("CRI").

Thus the present invention provides an illumination system, comprising a radiation source and a fluorescent material comprising at least one phosphor capable of absorbing a portion of the light emitted by the radiation source and emitting light of a wavelength different from that of the absorbed light; wherein said at least one phosphor is a garnet of general formula $(Lu_{1-x-y-a-b}Y_xGd_y)_3(Al_{1-z}Ga_z)_5O_{12}$:$Ce_aPr_b$, wherein $0<x<1$, $0<y<1$, $0<z\leq0.1$, $0<a\leq0.2$ and $0<b\leq0.1$.

Preferably the radiation source is selected from radiation sources having an emission with a peak emission wavelength in the range of 400 to 480 nm.

Preferably the radiation source is a light-emitting diode.

Another aspect of the present invention provides an illumination system comprising a fluorescent material comprising a garnet of general formula
$(Lu_{1-x-y-a-b}Y_xGd_y)_3(Al_{1-z}Ga_z)_5O_{12}$:$Ce_aPr_b$, wherein $0<x<1$, $0<y<1$, $0<z\leq0.1$, $0<a\leq0.2$ and $0<b\leq0.1$ at least one second phosphor; and wherein the values of x and y are selected such that $1-x-y-a-b>0$.

In particular, the fluorescent material is a white light-emitting phosphor blend, comprising a garnet of general formula $(Lu_{1-x-y-a-b}Y_xGd_y)_3(Al_{1-z}Ga_z)_5O_{12}$:$Ce_aPr_b$, wherein $0<x<1$, $0<y<1$, $0<z\leq0.1$, $0<a\leq0.2$, and $0<b\leq0.1$ and a red phosphor.

Such a red phosphor may be selected from the group of Eu(II)-activated phosphors, selected from the group $(Ca_{1-x}Sr_x)S$: Eu, wherein $0\leq x\leq 1$, and $(Sr_{1-x-y}Ba_xCa_y)_{2-z}Si_{5-a}Al_aN_{8-a}O_a$:$Eu_z$ wherein $0\leq a<5$, $0<x\leq1$, $0\leq y\leq1$, and $0<z\leq1$.

The concept for white-emitting LEDs according to the invention is based on a RGB mixture, i.e. the combination of a blue, red and green color. The essential factor is that the yellow-to-green and the red phosphors are so broad-banded that they also have a sufficient proportion of the emission throughout the whole spectral region.

The emission spectrum of such a fluorescent material has the appropriate wavelengths to obtain together with the blue light of the LED and the green light of the garnet according to the invention a high quality white light with good color rendering at the required color temperature.

Said white light illumination device has color coordinates substantially on a black body locus of a CIE chromaticity diagram.

Yielding white light emission with high color rendering is possible by the use of red and green broad-band emitter phosphors covering the whole spectral range together with a blue-emitting LED. A blend using wide-band phosphors according to the invention can have a relatively high color rendering index, even as high as 91-93.

Another aspect of the present invention provides a phosphor capable of absorbing a portion of the light emitted by the radiation source and emitting light of a wavelength different from that of the absorbed light; wherein said phosphor is a garnet of general formula
$(Lu_{1-x-y-a-b}Y_xGd_y)_3(Al_{1-z}Ga_z)_5O_{12}$:$Ce_aPr_b$, wherein $0<x<1$, $0<y<1$, $0<z\leq0.1$, $0<a\leq0.2$ and $0<b\leq0.1$.

These cerium-activated lutetium-aluminum-garnet phosphors comprise a host garnet activated for photoluminescence or X-ray with appropriate ions, which include lutetium and cerium. These garnets may also include praseodymium and other cations including mixtures of cations as activators.

The host garnets for these materials may be three-element (two cation) garnets such as lutetium aluminum garnet ($Lu_3Al_5O_{12}$), for example, or may comprise more than three elements such as lutetium-yttrium-aluminum garnet ($Lu_3Y_3Al_5O_{12}$), or lutetium-gallium-aluminum garnet (($Lu_3(Al,Ga)_5O_{12}$), for example.

The lutetium concentration influences the color locus of the emission light when used in a light source, in particular an LED. The color locus of this phosphor can be additionally fine-tuned using the ratio of the two concentrations Lu:Ce, which simplifies or optimizes adaptation to any further (yellow or red) phosphors in the LED.

In particular, those garnet compositions, that have praseodymium as an activator cation present at low concentrations are particularly desirable since such compositions show a sharp line emission also in the red region of the visible spectrum.

These phosphors are broad-band emitters wherein the visible emission is so broad that there is no 80 nm wavelength range where the visible emission is predominantly located.

These garnets phosphors emit a broad band in the yellow-green spectral range of the visible spectrum with very high intensity under both UV and blue excitations and thus can provide the green component in LEDs, that emit specific colors or white light. Total conversion efficiency may be up to 90%. Additional important characteristics of the phosphors include 1) resistance to thermal quenching of luminescence at typical device operating temperatures (e.g. 80° C.); 2) lack of interfering reactivity with the encapsulating resins used in the device; 3) suitable absorptive profiles to minimize dead absorption within the visible spectrum; 4) a temporally stable luminous output over the operating lifetime of the device and; 5) compositionally controlled tuning of the phosphor's excitation and emission properties. These garnet phosphors can be easily synthesized.

Preferably, the fluorescent material of the illumination system comprises a phosphor of general formula ($Lu_{1-x-y-a-b}Y_xGd_y)_3(Al_{1-z}Ga_z)_5O_{12}$:$Ce_aPr_b$, wherein $0<x<1$, $y=0$, $z=0$, $a=0.01$ and $b=0$.

In particular, the invention relates to a specific phosphor composition ($Lu_{0.99}Ce_{0.01})_3Al_5O_{12}$ which exhibits a high quantum efficiency of 80-90%, high absorbance in the range from 370 nm to 470 nm of 60-80% and low losses, below 10%, of the luminescent lumen output from room temperature to 100° C. due to thermal quenching.

DETAILED DESCRIPTION OF THE INVENTION

Figure 1:
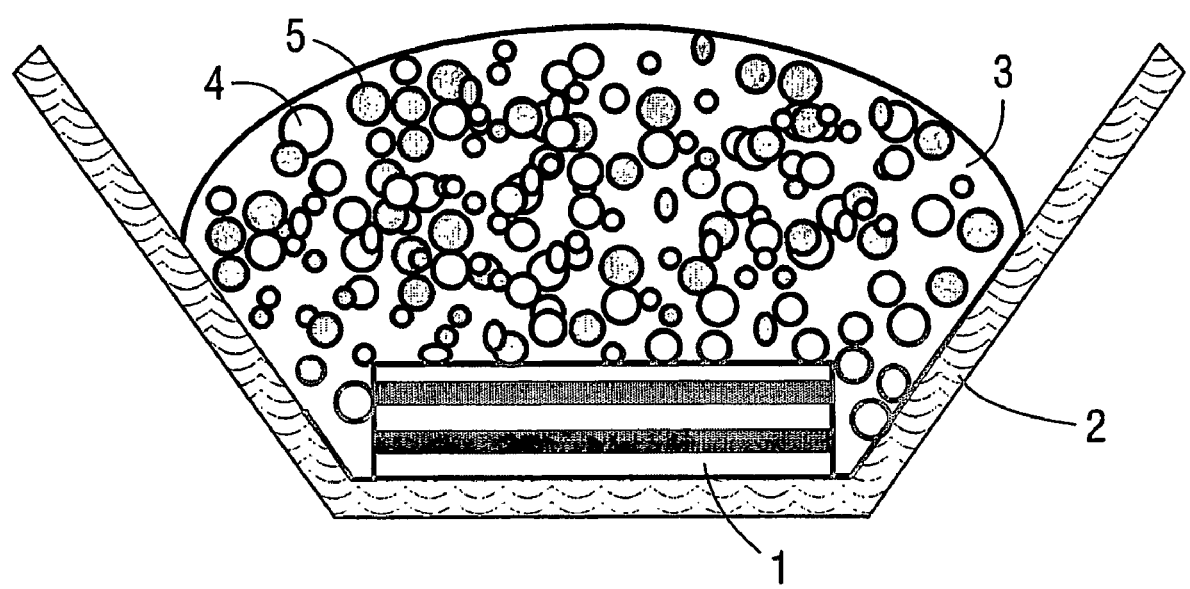
FIG. 1 is a schematic view of a tri-color white LED lamp comprising a two-phosphor blend of the present invention positioned in a pathway of light emitted by an LED structure.

The present invention focuses on a cerium-activated lutetium-aluminum garnet as a phosphor in any configuration of an illumination system containing a radiation source, including but not limited to discharge lamps, fluorescent lamps, LEDs, LDs and X-ray tubes. As used herein, the term "radiation" encompasses radiation in the UV, IR and visible regions of the electromagnetic spectrum.

While the use of the present phosphor is contemplated for a wide array of illumination devices, the present invention is described with particular reference to and finds particular application in light-emitting diodes, especially UV- and blue-light-emitting diodes.

The fluorescent material according to the invention comprises as a phosphor a cerium-activated lutetium-aluminum-garnet The phosphor conforms to the general formula ($Lu_{1-x-y-a-b}Y_xGd_y)_3(Al_{1-z}Ga_z)_5O_{12}$:$Ce_aPr_b$ wherein $0<x<1$, $0<y<1$, $0<z\leq0.1$, $0<a\leq0.2$ and $0<b\leq0.1$.

This class of phosphor material is based on activated luminescence of cubic garnet crystals. Garnets are a class of materials with the crystal chemical formula $A_3B_5O_{12}$.

A garnet crystal lattice has three different atomic occupying sites of dodecahedron octacoordination, octahedron hexacoordination and tetrahedron tetracoordination, in which the A cations are eight-coordinated with oxygens and the B cations are either octahedrally (six) or tetrahedrally (four) coordinated with oxygens. The crystal structure is cubic with 160 ions per unit cell containing eight formula units. In accordance with the present invention, the A cations are lutetium ions alone or in combination with yttrium and gadolinium, in combinations and with activator substitutions of cerium and possibly praseodymium. The B cations may be aluminum and possibly gallium or other ions, again, alone, in combinations and/or with substitutions. In particular, it was found that with activator ions substituted in the eight-coordinated or six-coordinated sites, these garnets are luminescent in response to X-ray stimulation. A particularly important activator ion, which is X-ray luminescent in this host material, is the $Ce^{3+}$ ion located in eight-coordinated sites.

Replacing some of the lutetium in a cerium-activated lutetium-aluminum garnet, $Lu_3Al_5O_{12}$:Ce phosphor with a smaller ion such as gadolinium $Gd^{3+}$ or yttrium $Y^{3+}$ causes a shift in the phosphor's emission band from green to the yellow range.

Replacing some of the aluminum in a cerium-activated lutetium-aluminum garnet, $Lu_3Al_5O_{12}$:Ce phosphor with a larger ion such as gallium $Ga^{3+}$ causes a shift in the phosphor's emission band from green to the blue range.

Replacing some of the cerium in a cerium-activated lutetium-aluminum garnet by praseodymium as a co-activator has the effect that the praseodymium produces secondary emission that is concentrated in the red region of the visible spectrum, instead of a typical broad-band secondary emission from cerium-activated lutetium-aluminum phosphor which is generally centered in the yellow region of the visible spectrum. The amount of praseodymium as a co-activator can vary, depending on the amount of red color that may be required in the white output light for a particular application.

Preferably these garnet phosphors may be coated with a thin, uniform layer of one or more compounds selected from the group formed by the fluorides and orthophosphates of the elements aluminum, scandium, yttrium, lanthanum gadolinium and lutetium, the oxides of aluminum, yttrium and lanthanum and the nitride of aluminum.

The layer thickness customarily ranges from 0.001 to 0.2 μm and, thus, is so thin that it can be penetrated by the radiation of the radiation source without substantial loss of energy. The coatings of these materials on the phosphor particles may be applied, for example, by deposition from the gas phase or a wet-coating process.

These phosphors are responsive to portions of the electromagnetic spectrum of higher energy than the visible portion of the spectrum.

In particular, the phosphors according to the invention are responsive to ultraviolet light as in fluorescent lamps and light-emitting diodes, visible light as in blue-emitting diodes, electrons (as in cathode ray tubes) and X-rays (as in radiography).

The invention also relates to an illumination system comprising a radiation source and a fluorescent material comprising at least one phosphor of general formula $(Lu_{1-x-y-a-b}Y_xGd_y)_3(Al_{1-z}Ga_z)_5O_{12}:Ce_aPr_b$ wherein $0<x<1$, $0<y<1$, $0<z\leqq0.1$, $0<a\leqq0.2$ and $0<b\leqq0.1$.

Radiation sources include semiconductor optical radiation emitters and other devices that emit optical radiation in response to electrical excitation. Semiconductor optical radiation emitters include light-emitting diode LED chips, light-emitting polymers (LEPs), organic light-emitting devices (OLEDs), polymer light-emitting devices (PLEDs), etc.

Moreover, light-emitting components such as those found in discharge lamps and fluorescent lamps, such as mercury low and high pressure discharge lamps, sulfur discharge lamps, and discharge lamps based an molecular radiators are also contemplated for use as radiation sources with the present inventive phosphor compositions.

In a preferred embodiment of the invention, the radiation source is a light-emitting diode.

Any configuration of an illumination system which includes a LED and a cerium-activated lutetium-aluminum garnet phosphor composition is contemplated in the present invention, preferably with the addition of other well-known phosphors, which may be combined to achieve a specific color or white light when irradiated by a LED emitting primary UV or blue light as specified above.

In a preferred embodiment of the invention the primary radiation source used is the radiation from a UV-emitting or blue-emitting LED chip. Particularly good results are achieved with a blue LED whose emission maximum lies at 400 to 480 nm.

An optimum has been found to lie at 445 to 460 nm, talking particular account of the excitation spectrum of the garnet phosphors.

A variant with particularly good color rendering is the joint use of two phosphors, namely a green emitting cerium-activated lutetium-aluminum-garnet phosphor of general formula $(Lu_{1-x-y-a-b}Y_xGd_y)_3(Al_{1-z}Ga_z)_5O_{12}:Ce_aPr_b$ wherein $0<x<1$, $0<y<1$, $0<z\leqq0.1$, $0<a\leqq0.2$ and $0<b\leqq0.1$ together with a red phosphor from the red-emitting europium-activated phosphors selected from the group of $(Ca_{1-x}Sr_x)S:Eu$, wherein $0\leqq x\leqq 1$ and $(Sr_{1-x-y}Ba_xCa_y)_{2-z}Si_{5-a}Al_aN_{8-a}O_a:Eu_z$ wherein $0\leqq a<5$, $0<x\leqq 1$, $0\leqq y\leqq 1$ and $0<z\leqq 1$.

Preferably a europium-activated calcium strontium sulfide is used, which is a high-chromaticity red phosphor excitable from the near UV (400 nm) to the blue-green (500 nm) with high quantum efficiency. For an optimized use of this phosphor for luminescent conversion of primary LED light, it is necessary to modify the photophysical characteristics to achieve, for example, efficacy, color specifications and life time of related light-emitting devices. The chromaticity and quantum efficiency of the europium-activated strontium sulfide can be modified through the substitution of divalent metal ions for strontium from the list including Ba, Ca, Mg, and Zn.

TABLE 1

| Phosphor composition | $\lambda_{max}$ [nm] | Color point x, y |
| --- | --- | --- |
| SrS:Eu | 610 | 0.627, 0.372 |
| $(Sr_{1-x-y}Ca_xBa_y)_2Si_5N_8:Eu$ | 615 | 0.615, 0.384 |
| $(Sr_{1-x-y}Ca_xBa_y)_2Si_{5-x}Al_xN_{8-x}O_x:EU$ | 615-650 | *depending on x, y |
| CaS:Eu | 655 | 0.700, 0.303 |
| $(Sr_{1-x}Ca_x)S:Eu$ | 610-655 | *depending on x |

The phosphor blend comprises a mixture of predetermined amounts and relative proportions of garnet-structured lutetium-aluminum oxide activated by cerium and calcium-strontium sulfide activated by divalent europium. The apatite structured material has a broad-band emission of visible radiation and the yttrium oxide material has a narrow emission in the red-orange region of the visible spectrum, while the relative phosphor proportions are such that the composite emission of the first phosphor layer falls approximately within the warm-white ellipse as inscribed on the x-y chromaticity diagram of the ICI system.

Especially preferred is a white emitting radiation source comprising an InGaN chip, emitting in the blue range of the visible spectrum with a peak emission at 455 nm together with a phosphor blend comprising $Lu_3Al_5O_{12}:Ce$ and CaS:Eu with the corresponding spectral weight ratio blue:green:red=1.1:2.4:2.18 which emits white light with color coordinates x=0.336 and y=0.339 and a color rendering index of 83 and a luminous efficiency of about 21 lumen/Watt. The spectra of such white-emitting LEDs comprising three different blends of $Lu_3Al_5O_{12}:Ce$ and CaS:Eu are given in FIG. 4.

A detailed construction of such a light-emitting device is shown in FIG. 1.

FIG. 1 is a schematic view of the device of the present invention. The device comprises LED 1. LED 1 is positioned in a reflector cup 2. LED 1 emits light in a pattern. A phosphor composition 4,5 is positioned in the pattern. The phosphor composition is embedded in a resin 3. In this example, reflector cup 2 can modify the light pattern if light is reflected into a space not previously covered by the initial light pattern (e.g. in the case of a parabolic reflector). It is understood that those skilled in the art can provide a reflector cup 2 in any shape that optimizes reflection of light back to phosphor composition 4,5, or optimizes the positioning of LED 1 to provide a light pattern for efficient conversion. For example, the walls of reflector cup 2 may be parabolic.

In one embodiment, the device further comprises a polymer for encapsulating the phosphor or phosphor blend. In this embodiment, the phosphor or phosphor blend should exhibit high stability properties in the encapsulant. Preferably, the polymer is optically clear to prevent significant light scattering. In one embodiment, the polymer is selected from the group consisting of epoxy and silicone resins. A variety of polymers are known in the LED industry for making LED lamps. Addition of the phosphor mixture to a liquid that is a polymer precursor can perform as encapsulation. For example, the phosphor mixture may be a powder. Introducing phosphor particles into a polymer precursor liquid results in formation of a slurry (i.e. a suspension of particles). Upon polymerization, the phosphor mixture is fixed rigidly in place by the encapsulation. In one embodiment, both the composition and the LED are encapsulated in the polymer.

The phosphors are applied either separately or in a mixture. The phosphors completely or partially absorb the light from the LED, which emits UV/blue light, and emit it again in other spectral regions (primarily yellow and green) in a sufficiently broad-band (specifically with a significant proportion of red) that an overall emission with the desired color point is formed.

Figure 2:
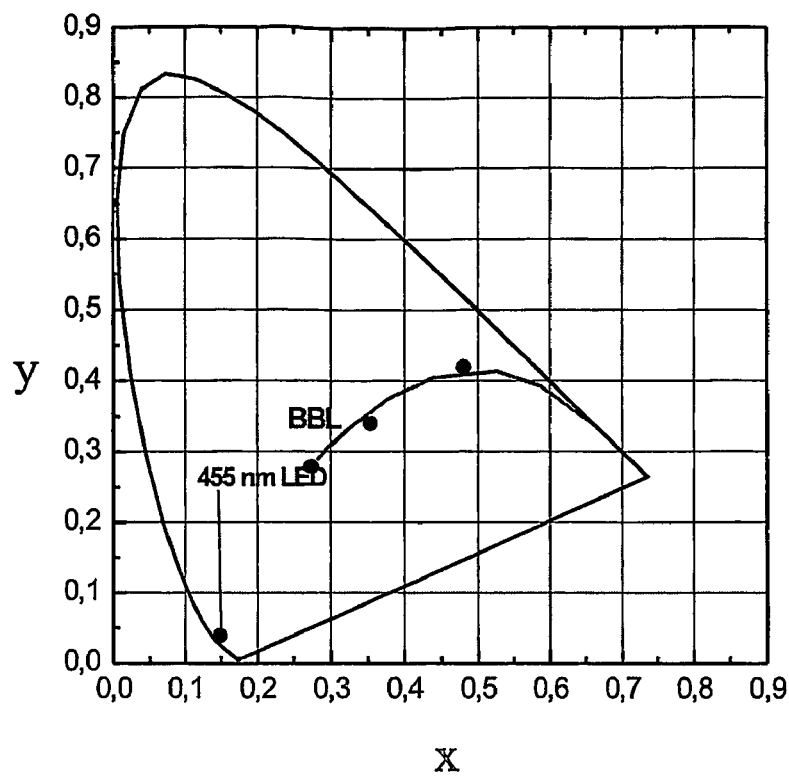
FIG. 2 shows the coordinates of the phosphor mixture of ($Lu_{0.495}Y_{0.495}Ce_{0.01})_3Al_5O_{12}$ and Sr $Ga_2S_4$:Eu in the chromaticity diagram of the Commission Internationals de l'Eclairage ("CIE"). Blends of these phosphors may be produced to have coordinates close to the black body locus.

The color points corresponding to a black body at various temperatures are given by the black body locus (BBL). Since the color emitted from a black body is considered to be white, and white light is generally desirable for a lamp, it is generally desirable that the color point of the light emitted from the luminescent material of a luminescent lamp should lie on or near the BBL. A portion of the BBL is shown in FIG. 2 with three color temperature points highlighted on the BBL corresponding to white light-emitting LEDs, whose emission spectra are given in FIG. 4.

Another figure of merit is the quality in rendering illuminated colors of a white light-emitting radiation source, which is indicated as the color rendering index (CRI). A CRI of 100 is an indication that the light emitted from the light source is similar to that from a black body source, i.e. an incandescent or halogen lamp. A CRI of 85 to 95 can be attained by applying a luminescent screen comprising $Lu_3Al_5O_{12}$:Ce and CaS:Eu in a blue-emitting LED.

Figure 4:
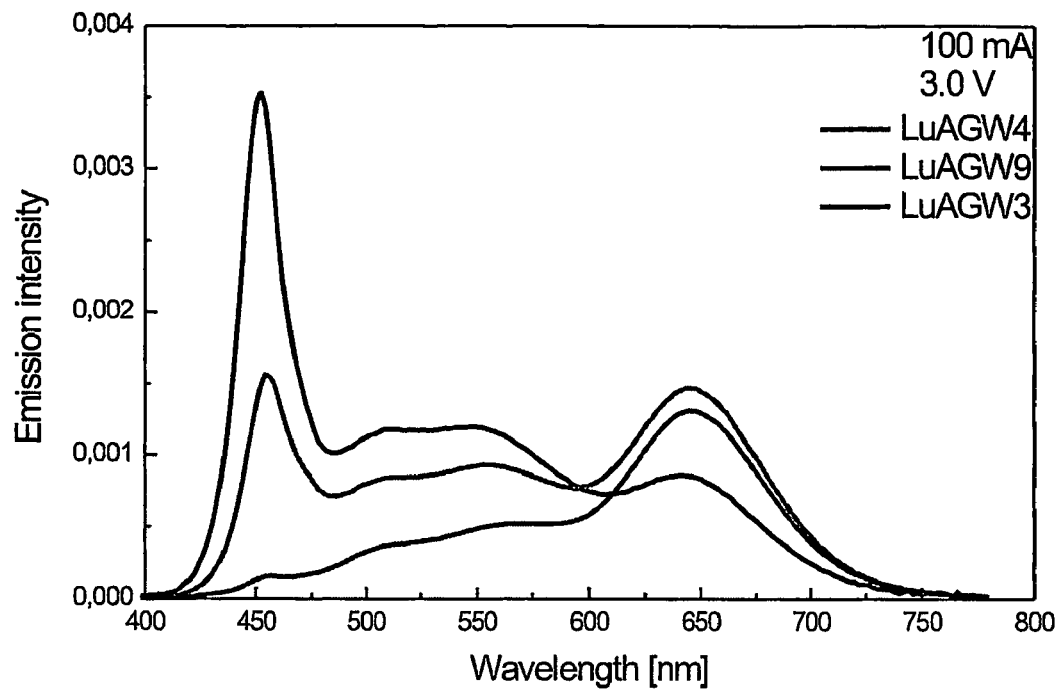
FIG. 4 discloses emission spectra of white LEDs upon excitation by a blue LED at 460 nm.

FIG. 4 shows the color coordinates of a range of illumination systems providing white light that can be produced from various combinations of blue LEDs and a cerium-activated lutetium-aluminum-garnet phosphor and CaS:Eu of the present invention.

More than one phosphor of the present invention may be incorporated in the same device to provide a color adjustment. A further group of embodiments is directed to a green-emitting illumination system with particularly good color rendering comprising the combination of a light-emitting semiconductor component which emits primary light in the blue spectral range from 420 to 480 nm together wherein a phosphor blend containing a green emitting cerium-activated lutetium-aluminum garnet phosphor $Lu_3Al_5O_{12}$:Ce, with the corresponding spectral weight ratio blue:green is chosen from 1.0:2.4 to 1.0:3.5 which emits green light with color coordinates x=0.336 and y=0.339 and a color rendering index of 83 and a luminous efficiency of about 450 lumen/Watt.

Due to the broad absorption band, the described phosphors exhibit suitable absorption or low reflectance in the disclosed spectral range from 370 nm to 480 nm for the primary light emitted by the light-emitting semiconductor component.

The green-emitting phosphor may be combined, if appropriate, with a further yellow or red-emitting phosphor for the production of specific colored light and more preferably for production of white light with a high color-rendering index of >80.

Figure 3:
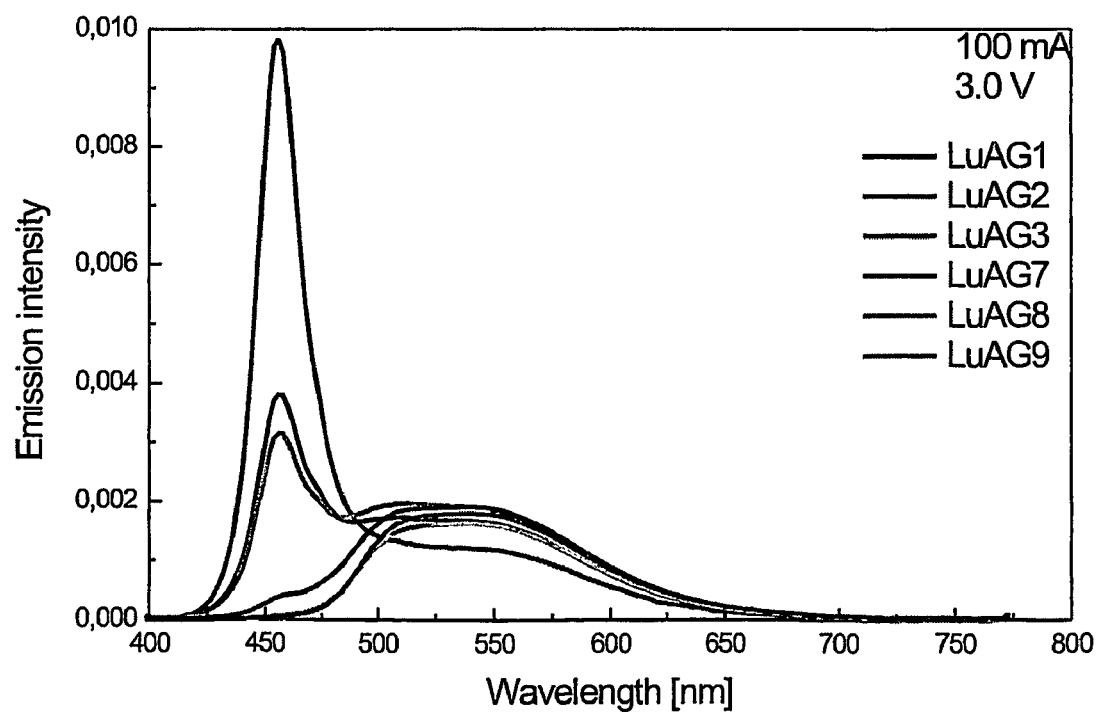
FIG. 3 discloses emission spectra of green LEDs upon excitation by a blue LED at 460 nm.

As a result of the green-to-yellow broad-band emission, a green emission can be generated which is shown in some examples in FIG. 3

SPECIFIC EXAMPLE

For the phosphor synthesis of a phosphor of general formula $(Lu_{1-x-y-a-b}Y_xGd_y)_3(Al_{1-z}Ga_z)_5O_{12}$:$Ce_aPr_b$, wherein $0<x<1$, $0<y<1$, $0<z\leq0.1$, $0<a\leq0.2$ and $0<b\leq0.1$ one or more of the starting materials may be oxygen-containing compounds such as oxides, nitrates, sulfates, acetates, citrates, or chlorates, which are soluble in a nitric acid solution. For example, amounts of $Lu_2O_3$, $Al(NO_3)_3 9H_2O$, $Ce(NO_3)_3 6H_2O$ and $AlF_3$ are blended and dissolved in a nitric acid solution. The strength of the acid solution is chosen to rapidly dissolve the oxygen-containing compounds and the choice is within the skills of those skilled in the art. The nitric acid solution is evaporated. The dried precipitate is ball milled or otherwise thoroughly blended and then calcined in a CO-atmosphere at about 1300° C. for a sufficient time to ensure a substantially complete dehydration of the starting material. The calcination may be carried out at a constant temperature. Alternatively, the calcination temperature may be ramped from ambient to and held at the final temperature for the duration of the calcination. After an intermittent milling step the calcined material is similarly fired at 1500-1700° C. under a reducing atmosphere such as $H_2$, CO, or a mixture of one of these gases with an inert gas for a sufficient time for the decomposition of the oxygen-containing compounds to convert all of the calcined material to the desired phosphor composition.

The resulting powder is milled on a roller bench for several hours. The milled powder has an average particle size of 40 to 60 μm.

Its quantum efficiency is 90% and its luminous efficiency is between 430 and 470 lm/W. The color point is at x=0.33 to 0.38, y=0.57 to 0.58.

TABLE 2

| Phosphor composition | $\lambda_{max}$ [nm] | Color point x, y |
|---|---|---|
| $(Lu_{0.99}Ce_{0.01})_3Al_5O_{12}$ | 515 + 540 | 0.339, 0.579 |
| $(Lu_{0.989}Ce_{0.01}Pr_{0.001})_3Al_5O_{12}$ | 515 + 540 + 610 | 0.332, 0.574 |
| $(Lu_{0.495}Y_{0.495}Ce_{0.01})_3Al_5O_{12}$ | 525 + 550 | 0.377, 0.570 |
| $(Lu_{0.75}Gd_{0.24}Ce_{0.01})_3Al_5O_{12}$ | 520 + 545 | 0.350, 0.573 |

Figure 5:
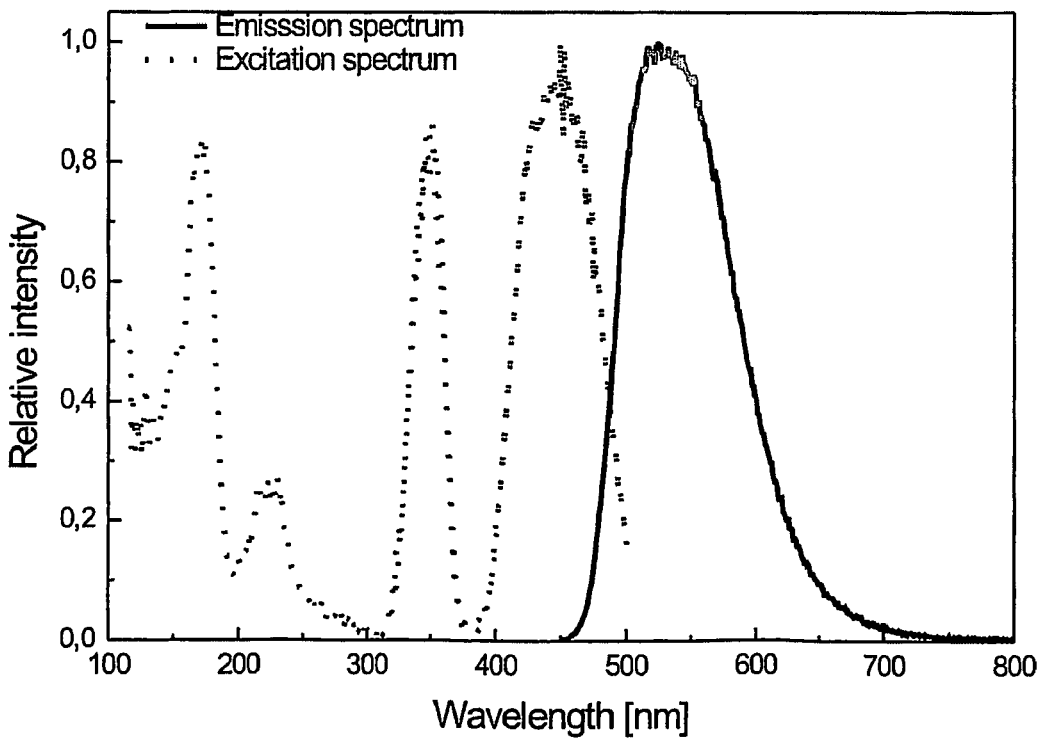
FIG. 5. discloses the excitation and emission spectra of ($Lu_{0.99}Ce_{0.01})_3Al_5O_{12}$.
Figure 6:
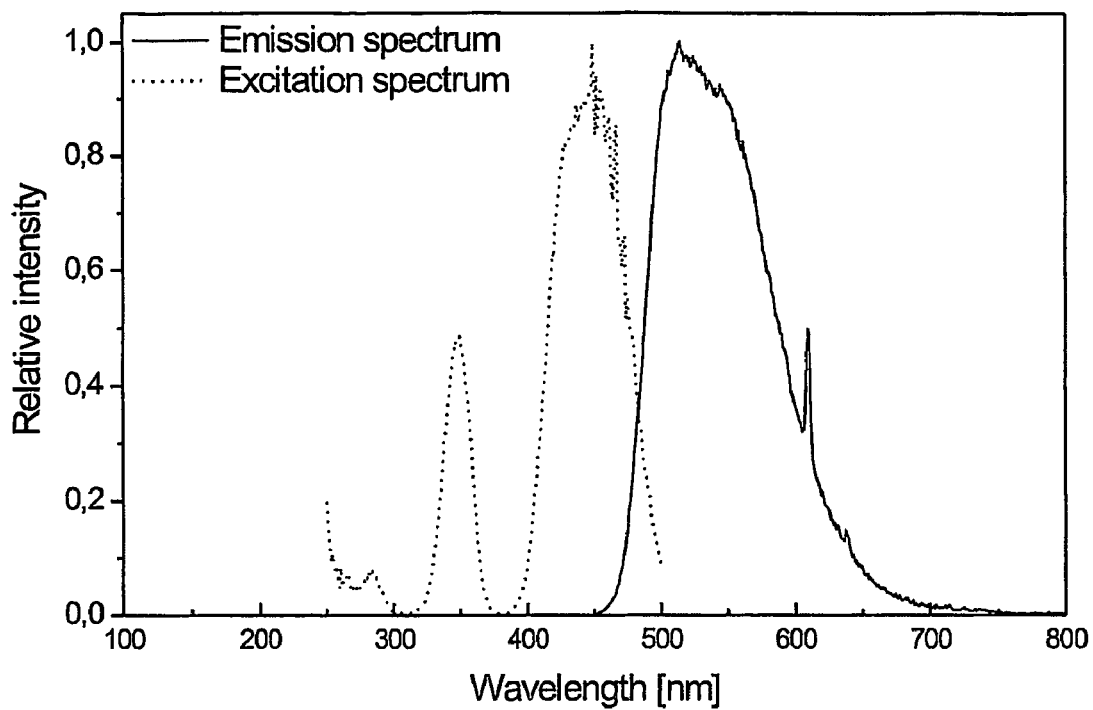
FIG. 6. discloses the excitation and emission spectra of ($Lu_{0.989}Ce_{0.01}Pr_{0.001})_3Al_5O_{12}$.
Figure 7:
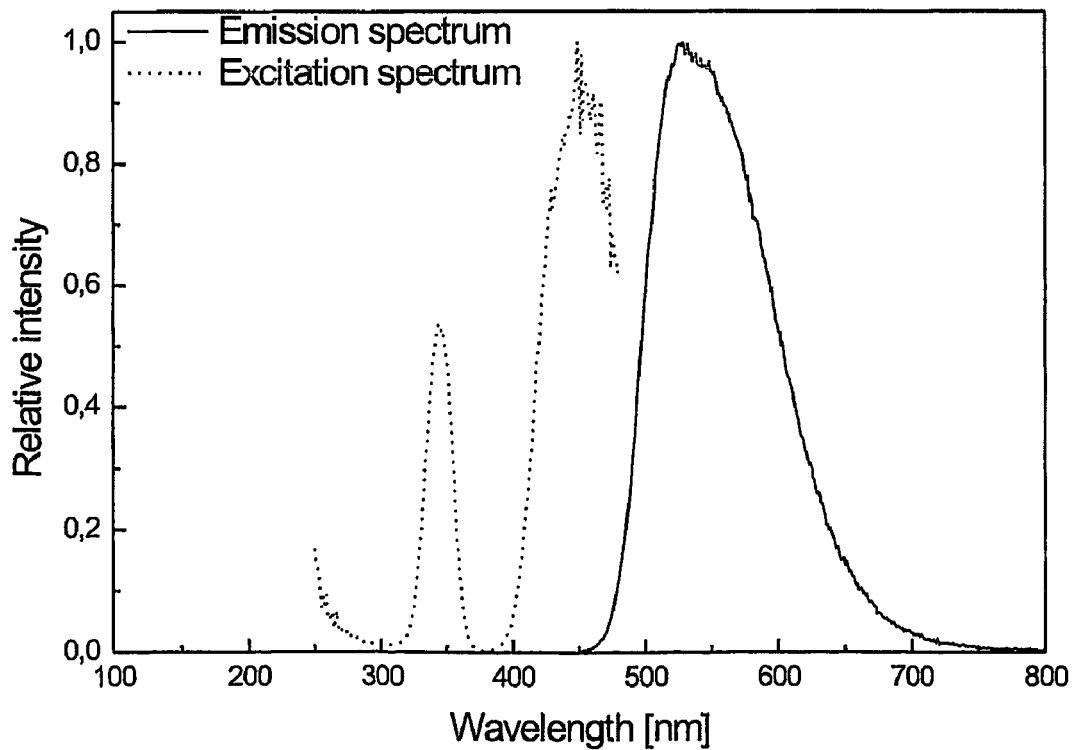
FIG. 7. discloses the excitation and emission spectra of ($Lu_{0.495}Y_{0.495}Ce_{0.01})_3Al_5O_{12}$.

In FIGS. 5, 6, 7 of the drawings accompanying this specification, the emission spectra of various compounds are given. When excited with radiation of 355 nm wavelength, these garnet phosphors are found to give a broad-band emission, which peaks at 515 nm.

FIG. 5 of the drawings accompanying this specification shows excitation and emission spectra for the composition $(Lu_{0.99}Ce_{0.01})_3Al_5O_{12}$.

FIG. 6 of the drawings accompanying this specification shows excitation and emission spectra for the composition $(Lu_{0.495}Y_{0.495}Ce_{0.01})_3Al_5O_{12}$.

FIG. 7 shows that $(Lu_{0.989}Ce_{0.01}Pr_{0.001})_3Al_5O_{12}$, when scanned for excitation is found to have a broad band (515-540 nm) excitation with a peak extending from 515-540 nm and a side band at 610 nm.

It is also clear from the excitation spectra that these cerium-activated lutetium-aluminum-garnet phosphors can be efficiently excited with radiation of wavelength 254 as well as 355 and 420 nm.

For manufacturing a white illumination system based on a 460 nm emitting InGaN LED, a phosphor blend comprising at least one garnet of general formula $(Lu_{1-x-y-a-b}Y_xGd_y)_3(Al_{1-z}Ga_z)_5O_{12}$:$Ce_aPr_b$ wherein $0<x<1$, $0<y<1$, $0<z\leq0.1$, $0<a\leq0.2$ and $0<b\leq0.1$ and one of the red phosphors according to Tab. 2 is suspended into a silicone precursor. A droplet of this suspension is deposited onto the LED chip and subsequently polymerized. A plastic lens seals the LED.

The invention claimed is:

1. Illumination system comprising a radiation source and a fluorescent material comprising at least one phosphor capable of absorbing a portion of the light emitted by the radiation source and emitting light of a wavelength different from that of the absorbed light; wherein said at least one phosphor is a garnet of general formula $(Lu_{1-x-y-a-b}Y_xGd_y)_3(Al_{1-z}Ga_z)_5O_{12}:Ce_aPr_b$, wherein $0<x<1$, $0<y<1$, $0<z\leq 0.1$, $0<a\leq 0.2$ and $0<b\leq 0.1$; and wherein values of x and y are selected such that $1-x-y-a-b>0$.

2. Illumination system according to claim 1, wherein the radiation source is selected from the radiation sources having an emission with a peak emission wavelength in a range of 400 to 480 nm.

3. Illumination system according to claim 1, wherein the radiation source is a light-emitting diode.

4. Illumination system according to claim 1, wherein the fluorescent material is a phosphor blend comprising a garnet of general formula $(Lu_{1-x-y-a-b}Y_xGd_y)_3(Al_{1-z}Ga_z)_5O_{12}:Ce_aPr_b$ wherein $0<x<1$, $0<y<1$ $0<z\leq 0.1$, $0<a\leq 0.2$ and $0<b\leq 0.1$ and at least one second phosphor.

5. Illumination system according to claim 1, wherein the radiation source is a blue-emitting diode and the fluorescent material is a phosphor blend comprising a garnet of general formula $(Lu_{1-x-y-a-b}Y_xGd_y)_3(Al_{1-z}Ga_z)_5O_{12}:Ce_aPr_b$, wherein $0<x<1$, $0<y<1$, $0<z\leq 0.1$, $0<a\leq 0.2$ and $0<b\leq 0.1$ and a red phosphor.

6. Illumination system according to claim 5, wherein the fluorescent material is a phosphor blend comprising a garnet of general formula $(Lu_{1-x-y-a-b}Y_xGd_y)_3(Al_{1-z}Ga_z)_5O_{12}:Ce_aPr_b$ wherein $0<x<1$, $0<y<1$, $0<z\leq 0.1$, $0<a\leq 0.2$ and $0<b\leq 0.1$ and a red phosphor selected from the group of Eu(II)-activated phosphors.

7. Illumination system according to claim 5, wherein the fluorescent material is a phosphor blend comprising a garnet of general formula $(Lu_{1-x-y-a-b}Y_xGd_y)_3(Al_zGa_z)_5O_{12}:Ce_aPr_b$ wherein $0<x<1$, $0<y<1$, $0<z\leq 0.1$, $0<a\leq 0.2$ and $0<b\leq 0.1$ and a red phosphor selected from the group $(Ca_{1-x}Sr_x)S:Eu$, wherein $0.1\leq x\leq 1$ and $(Sr_{1-x-y}Ba_xCa_y)_{2-z}Si_{5-a}Al_aN_{8-a}O_a:Eu_z$ wherein $0.1\leq a<5$, $0<x\leq 1$, $0\leq y\leq 1$ and $0<z\leq 1$.

8. Phosphor capable of absorbing a portion of the light emitted by a radiation source and emitting light of a wavelength different from that of the absorbed light; wherein said phosphor is a garnet of general formula $(Lu_{1-x-y-a-b}Y_xGd_y)_3(Al_{1-z}Ga_z)_5O_{12}:Ce_aPr_b$ wherein $0<x<1$, $0<y<1$, $0<z\leq 1$, $0<a\leq 0.2$ and $0<b\leq 1$; and wherein values of x and y are selected such that $1-x-y-a-b<0$.

9. Phosphor according to claim 8, wherein the phosphor has a coating selected from the group of fluorides and orthophosphates of the elements aluminum, scandium, yttrium, lanthanum, gadolinium and lutetium, the oxides of aluminum, yttrium and lanthanum and the nitride of aluminum.

10. The illumination system of claim 1, wherein said at least one phosphor comprises one of $(Lu_{0.99}Ce_{0.01})_3Al_5O_{12}$, $(Lu_{0.989}Ce_{0.01}Pr_{0.001})_3Al_5O_1$, $(Lu_{0.495}Y_{0.495}Ce_{0.01})_3Al_5O_{12}$, and $(Lu_{0.75}Gd_{0.24}Ce_{0.01})_3Al_5O_{12}$.

11. The phosphor of claim 8, wherein said phosphor comprises one of $(Lu_{0.99}Ce_{0.01})_3Al_5O_{12}$, $(Lu_{0.989}Ce_{0.01}Pr_{0.001})_3Al_5O_1$, $(Lu_{0.495}Y_{0.495}Ce_{0.01})_3Al_5O_{12}$, and $(Lu_{0.75}Gd_{0.24}Ce_{0.01})_3Al_5O_{12}$.

* * * * *